(12) United States Patent
Tan et al.

(10) Patent No.: US 7,528,667 B1
(45) Date of Patent: May 5, 2009

(54) T-NETWORK CAPBANK

(75) Inventors: Chun Geik Tan, Singapore (SG); Randy Tsang, Foster City, CA (US); Yonghua Song, Cupertino, CA (US)

(73) Assignee: Marvell International Ltd. (BM)

( * ) Notice: Subject to any disclaimer, the term of this patent is extended or adjusted under 35 U.S.C. 154(b) by 72 days.

(21) Appl. No.: 11/489,835

(22) Filed: Jul. 19, 2006

Related U.S. Application Data

(60) Provisional application No. 60/737,266, filed on Nov. 16, 2005.

(51) Int. Cl.
H03B 5/08 (2006.01)
(52) U.S. Cl. .................................. 331/36 C; 331/177 V
(58) Field of Classification Search ............... 331/36 C, 331/117 R, 167, 177 V
See application file for complete search history.

(56) References Cited

U.S. PATENT DOCUMENTS 6,211,745 B1 * 4/2001 Mucke et al. ........... 331/117 R
6,239,665 B1 * 5/2001 Strom ................... 331/117 FE
6,281,758 B1 * 8/2001 Elsayed et al. ................ 331/16
6,621,365 B1 * 9/2003 Hallivuori et al. ........... 331/179
7,113,052 B2 * 9/2006 Dunworth ................... 331/179

\* cited by examiner

*Primary Examiner*—Robert Pascal
*Assistant Examiner*—Levi Gannon

(57) ABSTRACT

A capacitor bank adapted to provide a variable capacitance to an electronic circuit is provided. The capacitor bank has at least a most significant bit and a least significant bit and includes a first capacitor cell having a first capacitance value and disposed between a first node and a second node, thereby forming the most significant bit. The capacitor bank also includes a second capacitor cell having a second capacitance value and disposed between the first node and the second node, thereby forming the least significant bit. The second capacitance value is less than the first capacitance value. Additionally, the second capacitor cell includes a first T-network capacitor unit in electrical communication with a source of a transistor and a second T-network capacitor unit in electrical communication with a drain of the transistor.

30 Claims, 9 Drawing Sheets

T-NETWORK CAPBANK

CROSS-REFERENCES TO RELATED APPLICATIONS

This application claims priority under 35 U.S.C. § 119(e) to U.S. Provisional Application No. 60/737,266, entitled "T-Network Capbank," filed on Nov. 16, 2005, commonly assigned, and hereby incorporated by reference in its entirety.

BACKGROUND OF THE INVENTION

The present invention relates generally to capacitor banks adapted to provide a variable capacitance to an electronic circuit. More particularly, the present invention relates to a method and apparatus for providing a controllable capacitance value for a high frequency voltage controlled oscillator (VCO).

For a VCO, the resonant frequency of operation is determined by the equation:

$$f = \frac{1}{2\pi\sqrt{LC}}, \tag{1}$$

where L and C are the inductance and capacitance of the resonant circuit, respectively. In some conventional systems operating in the kHz range, the variable capacitance value C is selected using a varactor. In other systems, a capacitor bank with a number of fixed capacitance values is utilized in conjunction with a varactor, which provides the variable capacitance.

In order to provide a series of capacitance values for a VCO, a series of capacitor cells are connected in parallel to form a capacitor bank. FIG. 1 is a simplified schematic diagram illustrating a conventional capacitor cell. As illustrated in FIG. 1, conventional capacitor cell 100 includes two metal-insulator-metal (MIM) capacitors 110 and 112 in series with an NMOS transistor 114 serving as a switch. Transistor 130 and resistor 132 are utilized to establish a biasing condition for node 140 and transistor 134 and resistor 136 are utilized to establish a biasing condition for node 142.

There are two modes of operation for the conventional capacitor cell 100 illustrated in FIG. 1. In the first mode of operation, the NMOS transistor 114 is OFF. In this mode, the single-ended capacitance seen by node 120 includes the parasitic source-to-bulk capacitance ($C_{SB}$) or the parasitic drain-to-bulk ($C_{DB}$) (not shown) associated with NMOS transistor 114 plus the parasitic source-to-gate capacitance ($C_{SG}$) or the parasitic drain-to-gate capacitance ($C_{DG}$) (not shown) associated with NMOS transistor 114. In the second mode of operation, the NMOS transistor 114 is ON. In this mode, the single-ended capacitance seen by node 120 is approximately equal to the capacitance of MIM capacitor 110. In the second mode, the parasitic capacitances are negligible. The same description equally applies to node 122.

Hence, the overall change in capacitance available using the conventional capacitor cell 100 is approximately equal to the difference between the capacitance of the MIM capacitor 110 and the parasitic capacitances. This difference is approximately equal to the capacitance of the MIM capacitor 110.

In current applications, including applications such as WLAN 802.11a/b/g applications, there is a need to form capacitor banks with minimum capacitance resolution on the order of a few femtoFarads (fF), for example, 2-5 fF. In particular, high frequency operations at, for example, 12 GHz, utilize minimum capacitance values in this range. However, if a capacitor bank is implemented using a conventional capacitor cell as illustrated in FIG. 1, including MIM capacitors characterized by such small capacitance values, variations in the capacitor fabrication process will lead to large random capacitance variations, adversely impacting system performance. Thus, there is a need in the art for improved methods and systems for providing variable capacitance values.

SUMMARY OF THE INVENTION

According to the present invention, capacitor banks adapted to provide a variable capacitance to an electronic circuit are provided. More particularly, the present invention relates to a method and apparatus for providing a controllable capacitance value for a high frequency voltage controlled oscillator (VCO). But it would be recognized that the invention has a much broader range of applicability.

In an embodiment, a capacitor bank includes a first capacitor cell adapted to provide a first capacitance value between a first node and a second node. The capacitor bank also includes a second capacitor cell adapted to provide a second capacitance value between the first node and the second node. The second capacitance value is less than the first capacitance value. Additionally, the second capacitor cell includes a transistor, a first T-network capacitor unit in electrical communication with a source of the transistor, and a second T-network capacitor unit in electrical communication with a drain of the transistor.

According to another embodiment of the present invention, a capacitor cell is provided. The capacitor cell includes a first T-network capacitor unit in electrical communication with a first node and a source of a transistor. The capacitor cell also includes a second T-network capacitor unit in electrical communication with a drain of the transistor and a second node.

Many benefits are achieved by way of the present invention over conventional techniques. For example, embodiments of the present invention utilize capacitors characterized by increased minimum capacitance value. The impact of manufacturing non-uniformities is reduced for such increased capacitance devices, improving manufacturing yield. Depending upon the embodiment, one or more of these benefits, as well as other benefits, may be achieved. These and other benefits will be described in more detail throughout the present specification and more particularly below in conjunction with the following drawings.

DETAILED DESCRIPTION OF SPECIFIC EMBODIMENTS

Figure 2:
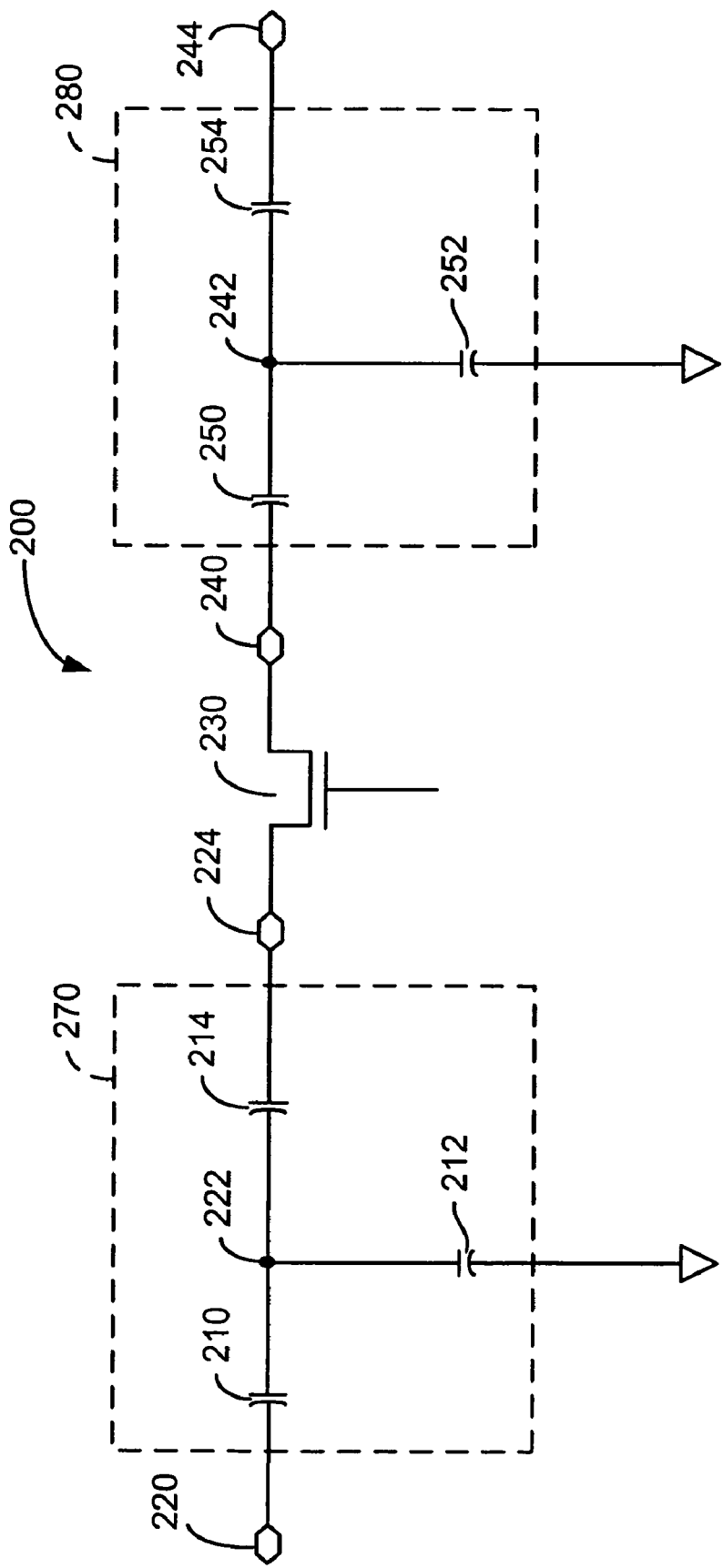
FIG. 2 is a simplified schematic diagram illustrating a T-network capacitor cell according to an embodiment of the present invention.

FIG. 2 is a simplified schematic diagram illustrating a T-network capacitor cell according to an embodiment of the present invention. As illustrated in FIG. 2, capacitors 210 and 214 are connected in series with capacitor 212 connected between node 222 and electrical ground. The three capacitors 210, 212, and 214 form a T-network capacitor unit 270 that is the left portion of the T-network capacitor cell 200. A terminal of capacitor 214 is connected to the drain of NMOS transistor 230. The source of NMOS transistor 230 is connected to another T-network capacitor unit 280, formed by capacitors 250, 252, and 254, that is the right portion of the T-network capacitor cell 200. In embodiments of the present invention, the capacitors 210, 212, 214, 250, 252, and 254 are MIM capacitors, although other types of capacitors are included within the scope of the present invention.

Utilizing embodiments of the present invention, a capacitor bank utilizing a plurality of T-network capacitor cells provides a single-ended capacitance with a high resolution ranging in some embodiments, for example, from about 2 fF to about 4 fF per cell. Of course, the particular value of the single-ended capacitance resolution is a function of the values utilized for the capacitors in the particular T-network capacitor cells. One of ordinary skill in the art would recognize many variations, modifications, and alternatives.

The operation of the T-network capacitor cell 200 is described as follows in reference to FIG. 2. If the transistor 230 is OFF, the capacitance seen by node 220 is equal to the capacitance of capacitor 210 in series with capacitor 212. When transistor 230 is OFF, capacitor 214 is in series with the open circuit and floating. In operation, the capacitor 214 is in series with a parasitic capacitance (not shown) associated with the transistor 230, which can be represented by a parasitic capacitor between node 224 and ground. Since this parasitic capacitance is typically small in comparison to the capacitance of capacitor 214, this parasitic capacitance is ignored in this analysis for purposes of clarity. Of course, as will be evident to one of skill in the art, parasitic effects are incorporated in computations utilized in designing implementations based on embodiments of the present invention.

Thus, ignoring these non-ideal effects for the purposes of this analysis, when transistor 230 is OFF, capacitor 210 is seen as being in series with capacitor 212 from node 220. If, for example, the value of the capacitors 210 and 212 is equal to a unit capacitance ($C_U$), the total capacitance seen by node 220 when transistor 230 is OFF is $C_U/2$.

If, on the other hand, transistor 230 is ON, for purpose of AC analysis, node 224 is seen as a ground terminal. Ignoring any parasitic capacitances associated with the transistor 230, capacitor 212 is, in effect, in parallel with capacitor 214. Both capacitors have a terminal connected to ground and a terminal connected to node 222, hereinafter alternatively referred to as a T-node. Continuing with the previous example, for capacitors with unit capacitance, the total capacitance seen by mode 222 is $2C_U$. Accordingly, the total capacitance seen by node 220 when transistor 230 is ON is equal to the capacitance resulting from capacitor 210 in series with $2C_U$, which, for all capacitances being equal to a unit capacitance, is equal to $C_U/3$.

Thus, for the T-network capacitor cell 200 provided herein, the difference in capacitance for the condition in which transistor 230 is OFF and ON is $C_U/2 - C_U/3 = C_U/6$. In other words, in comparison with conventional capacitor cells, capacitors six times larger than the desired difference in capacitance ($\Delta C$) may be utilized in embodiments of the present invention, reducing variations resulting from manufacturing and the like.

$$\Delta C = \frac{C_U}{6}. \tag{7}$$

Utilizing a T-network cell as provided by embodiments of the present invention, the change in capacitance provided by the cell is a fraction of the capacitance of the various capacitors utilized in constructing the capacitor cell. Utilizing capacitors characterized by a large capacitance in comparison to the $\Delta C$ achieved herein, the impact of variations in manufacturing are reduced. For example, in a conventional cell using a capacitor of, for example, 3 fF, a random variation of 1 fF during manufacturing results in an uncontrolled variation of 33%. However, utilizing a capacitor cell provided by embodiments of the present invention, the same $\Delta C$ is achieved using a minimum capacitor value of 18 fF, for which the manufacturing variation is a mere 5%. Since the capacitance value is generally related to the size of the capacitor, the increase in size reduces manufacturing variability.

Figure 3A:
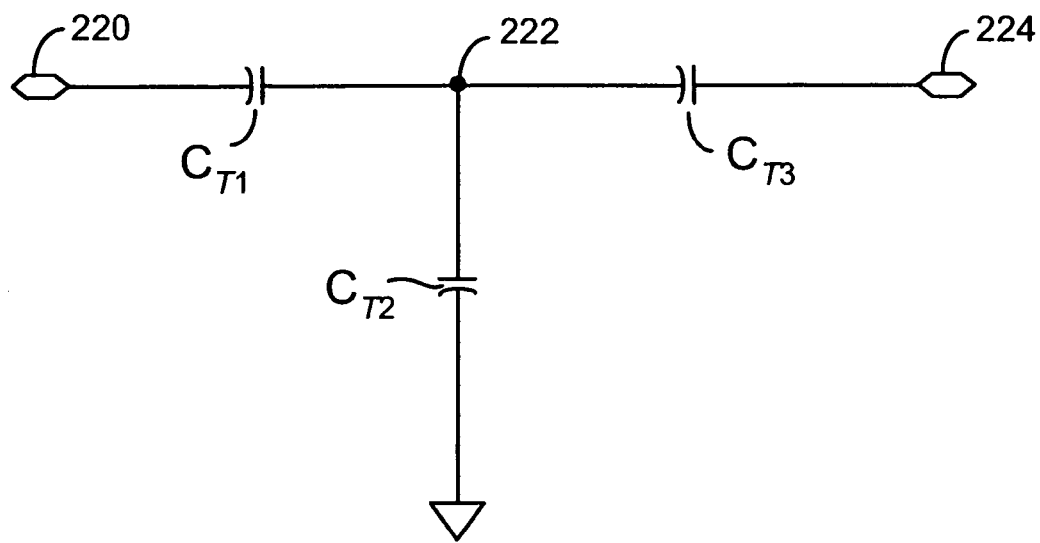
FIG. 3A is a simplified schematic diagram illustrating a T-network capacitor unit.
Figure 3B:
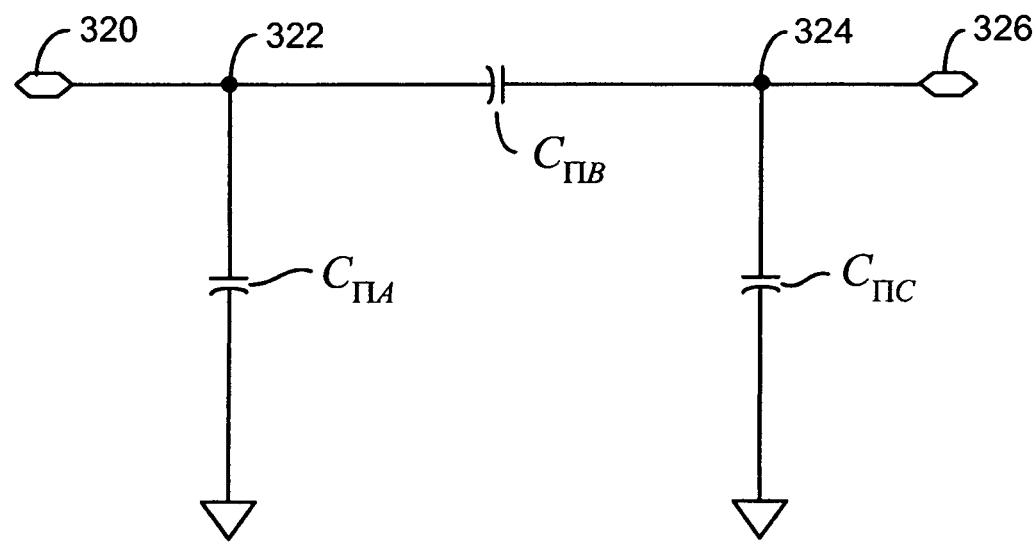
FIG. 3B is a simplified schematic diagram illustrating a π-network capacitor unit.

FIG. 3A is a simplified schematic diagram illustrating a T-network capacitor unit and FIG. 3B is a simplified schematic diagram illustrating a π-network capacitor unit. Referring to FIGS. 3A and 3B, the conversion of a T-network capacitor unit to a 7-network capacitor unit is performed as follows. The values of $C_{\Pi A}$, $C_{\Pi B}$, and $C_{\Pi C}$ are computed as:

$$C_{\Pi A} = \frac{C_{T1} C_{T2}}{C_{T1} + C_{T2} + C_{T3}}, \tag{2}$$

$$C_{\Pi B} = \frac{C_{T1} C_{T3}}{C_{T1} + C_{T2} + C_{T3}}, \text{ and} \tag{3}$$

$$C_{\Pi C} = \frac{C_{T2} C_{T3}}{C_{T1} + C_{T2} + C_{T3}}. \tag{4}$$

In an embodiment, the values of $C_{T1}$, $C_{T2}$, and $C_{T3}$ are selected to be equal to a unit capacitance $C_U$, i.e., $C_{T1} = C_{T2} = C_{T3} = C_U$. Accordingly, omitting the parasitic capacitance for purposes of ease of computation, equations (2), (3), and (4) can be rewritten as:

$$C_{\Pi A} = \frac{C_U}{3}, \tag{5}$$

$$C_{\Pi B} = \frac{C_U}{3}, \text{ and} \tag{6}$$

$$C_{\Pi C} = \frac{C_U}{3}. \tag{7}$$

It is understood that capacitance values associated with capacitors $C_{T1}$, $C_{T2}$, and $C_{T3}$ are a combination of the capacitance of the MIM capacitor (e.g., a unit capacitance $C_U$) and parasitic capacitances (such as junction capacitances). Typically, these parasitic capacitance values are included in computations, although, for purposes of clarity, these parasitic values have been omitted here.

Figure 1:
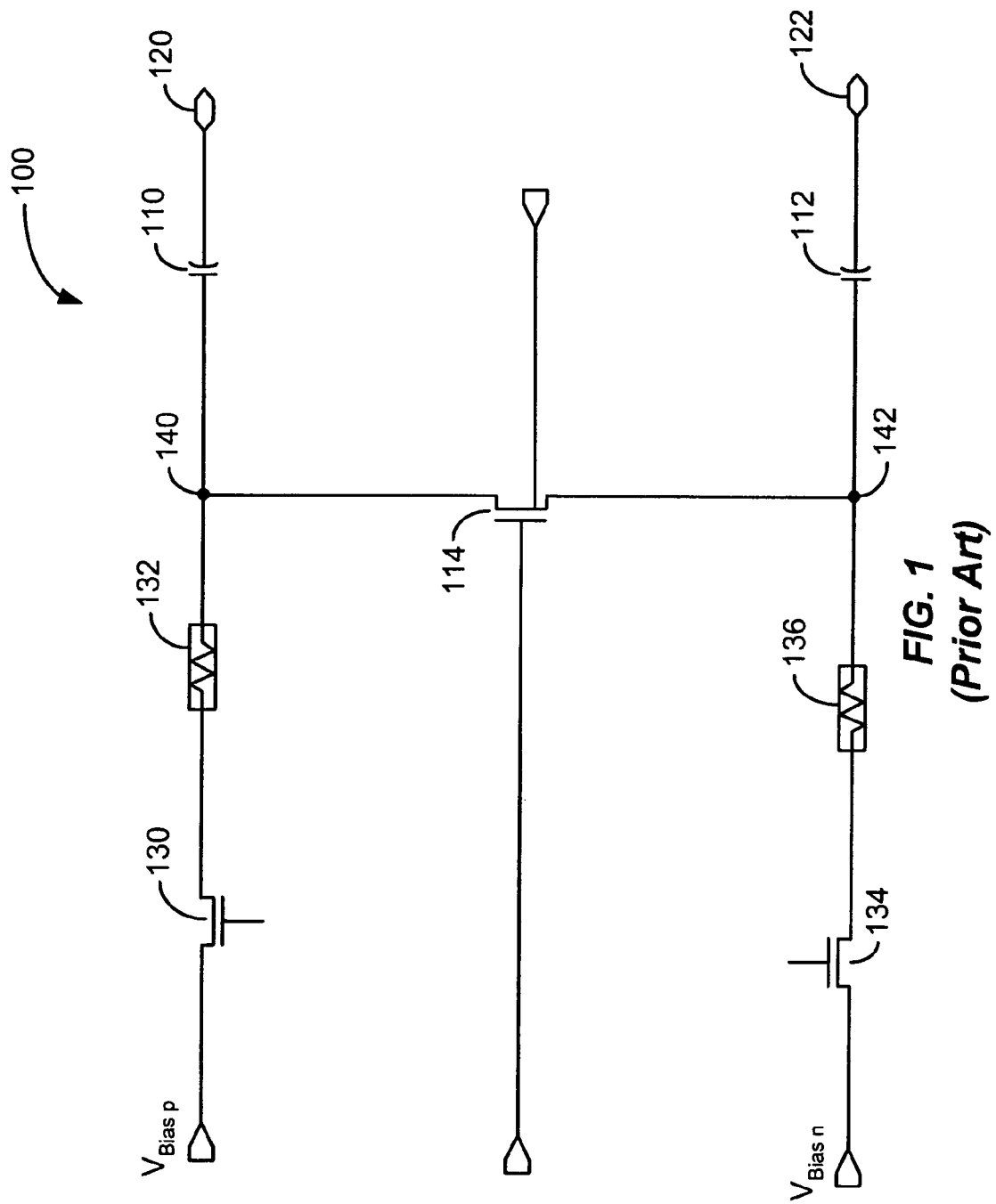
FIG. 1 is a simplified schematic diagram illustrating a conventional capacitor bank.
Figure 4A:
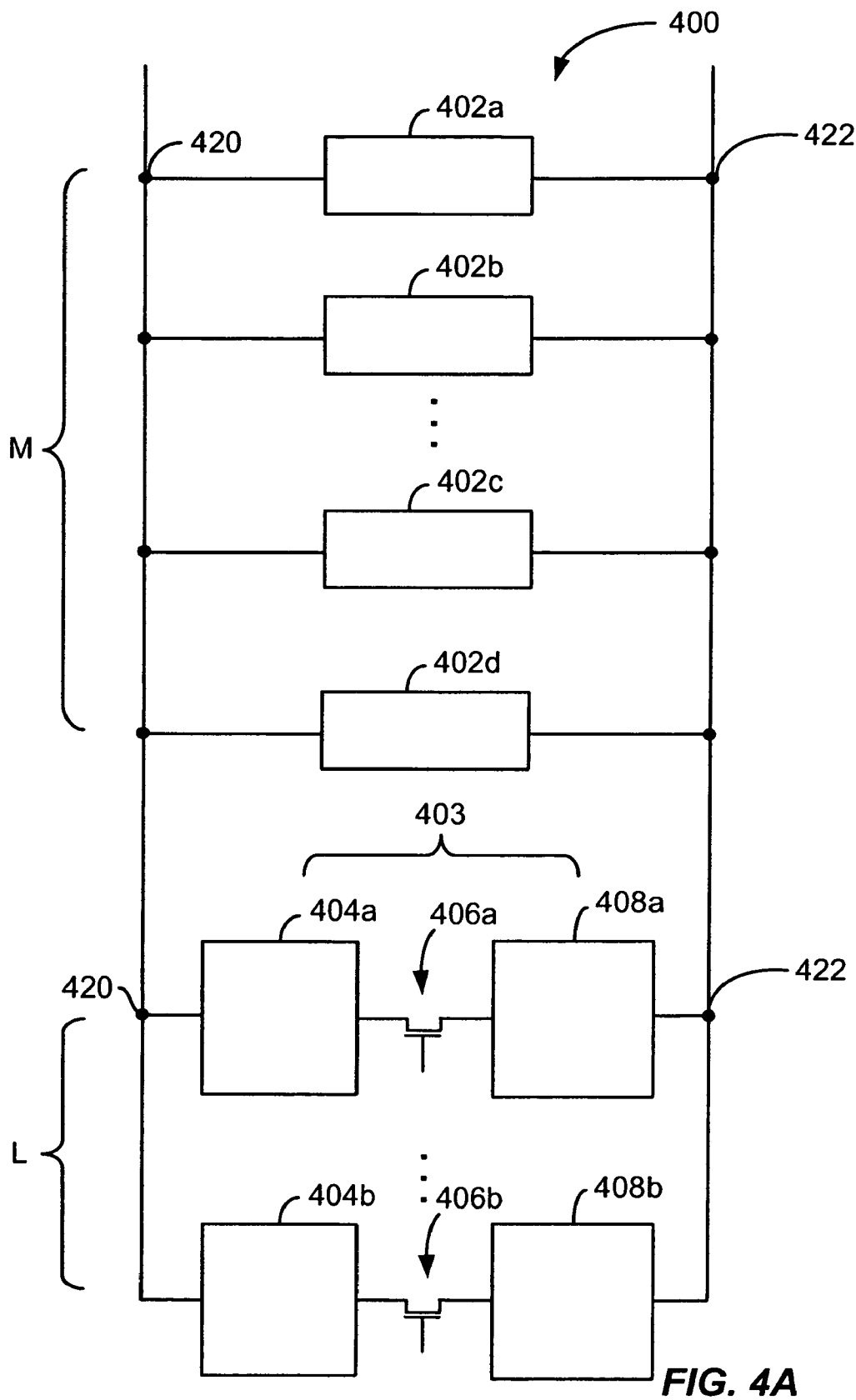
FIG. 4A is a simplified block diagram illustrating a capacitor bank according to an embodiment of the present invention.

FIG. 4A is a simplified block diagram illustrating a capacitor bank according to an embodiment of the present invention. The capacitor bank 400 has at least a most significant bit portion (M) and a least significant bit portion (L). The most significant bit portion M includes one or more capacitor cells 402 electrically connected between node 420 and node 422, thereby forming a number of most significant bits. Merely by way of example, conventional capacitor cells as illustrated in FIG. 1 are utilized in some embodiments to form capacitor cells 402. In other embodiments, other capacitor cells are utilized to form capacitor cells 402. As shown in FIG. 4A, the various capacitance values associated with the most significant bit capacitor cells 402 may vary from cell to cell.

The least significant bit portion L of capacitor bank 400 includes one or more capacitor cells 403, each of the capacitor cells 403 including a first T-network capacitor unit 404, a transistor 406, and a second T-network capacitor unit 408, thereby forming a least significant bit. Merely by way of example, T-network capacitor units 270 and 280 as illustrated in FIG. 2 are utilized in some embodiments to form the first T-network capacitor unit 404 and the second T-network capacitor unit 408, respectively. Of course, the present invention is not limited to this particular example. One of ordinary skill in the art would recognize many variations, modifications, and alternatives. The capacitor cells 403 included in the least significant bit portion are also electrically connected between node 420 and 422. As described more fully throughout the present specification, one or more most significant bit capacitor cells 402 and one or more least significant bit capacitor cells 403 may be utilized to provide a variable capacitance to an electronic circuit.

Figure 4B:
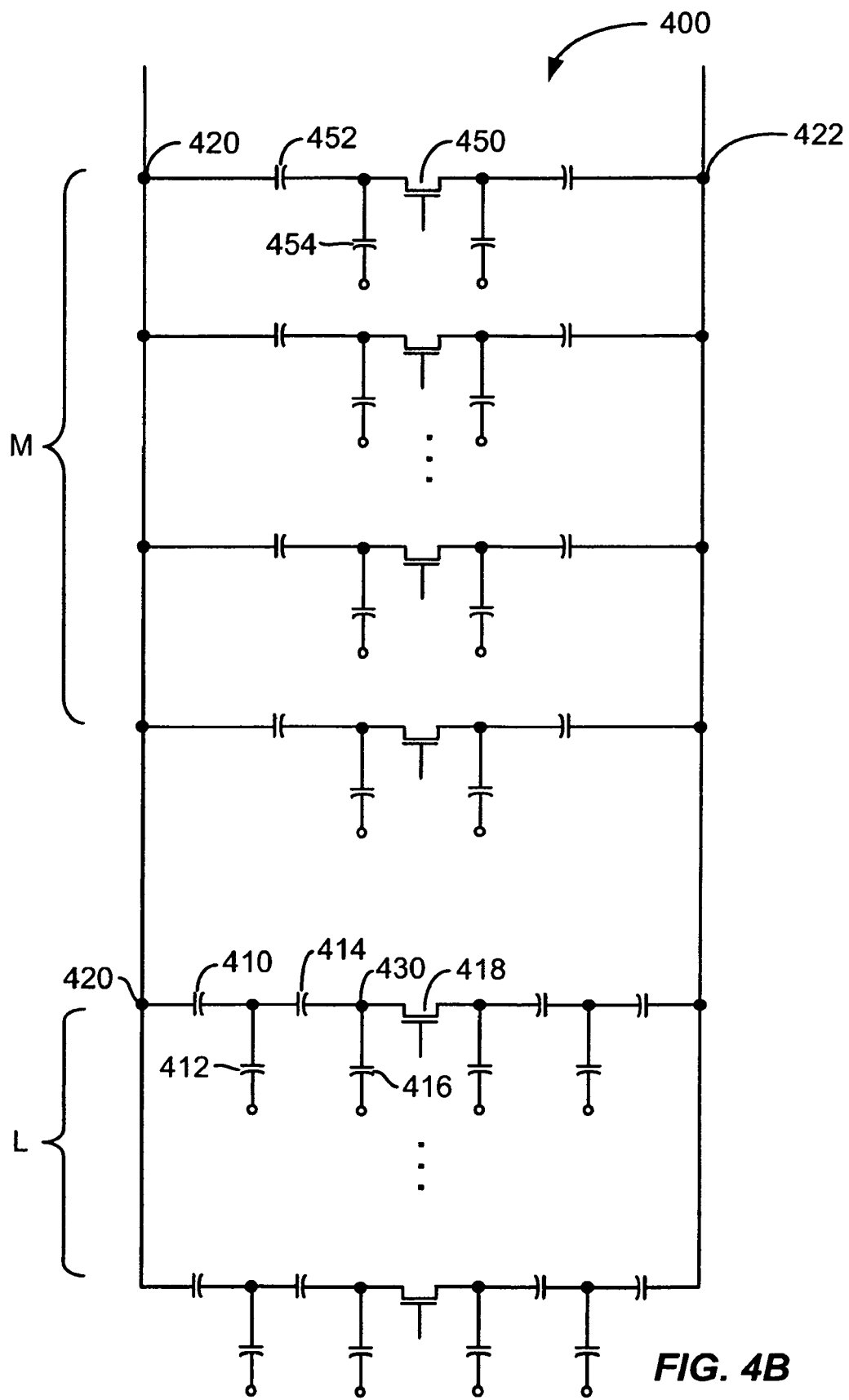
FIG. 4B is a simplified schematic diagram illustrating a capacitor bank according to an embodiment of the present invention.

FIG. 4B is a simplified schematic diagram illustrating a capacitor bank according to an embodiment of the present invention. The capacitor bank 400 is an M+N-bit capacitor bank that is divided into two portions: M Most Significant Bit (MSB) cells, which utilize a conventional capacitor cell as illustrated in FIG. 1; and N Least Significant Bit (LSB) cells, which utilize a T-network capacitor cell according to an embodiment of the present invention. In the embodiment illustrated in FIG. 4B, M=6 and N=4. In alternative embodiments other numbers of MSB and LSB cells are utilized as appropriate to the particular application. In use, the MSB cells provide a range of predefined capacitance values of greater value than the LSB cells. Accordingly, by selectively activating a predetermined number of MSB and LSB cells, a variable capacitance is provided at nodes 420 and 422.

Referring to the top branch of FIG. 4B (the MSB branch), when transistor 450 is OFF, capacitor 452 is in series with parasitic capacitor 454. Since parasitic capacitor 454 is negligible in comparison to capacitor 452, the single-ended capacitance seen by node 420 is relatively small. On the other hand, when transistor 450 is ON, the capacitance seen by node 420 into this cell is equal to the capacitance of capacitor 452. Accordingly, the ΔC achieved for the MSB cells is equal to $C_U$ for capacitors with unit capacitance. According to some embodiments of the present invention, the capacitors utilized in the MSB cells have the same capacitance values as the capacitors utilized in the LSB cells. Because embodiments of the present invention provide LSB cells with six times finer resolution than MSB cells, random variation in capacitance due to manufacturing variations is well tolerated. As will be understood, when transistor 450 is ON, the mid-point of the transistor is a virtual analog ground. Therefore, the capacitors to the right of transistor 450 can be ignored for the purposes of this discussion.

Referring to the bottom branch of FIG. 4B (the LSB branch), L T-network capacitor cells are provided as part of the capacitor bank 400. The operation of the T-network capacitor cell has already been described with reference to FIG. 2. Each of the LSB cells include a T-network capacitor unit comprising capacitors 410, 412, and 414. For purposes of completeness, parasitic capacitor 416 is included in FIG. 4B. Although the capacitance due to the parasitic capacitor 416 will be treated as negligible in some calculations described herein, such capacitances and other parasitic effects are incorporated in computations utilized in designing implementations based on embodiments of the present invention.

Referring to FIG. 4B, when transistor 418 is OFF, node 430 is floating and capacitor 414 is in series with parasitic capacitor 416, which is negligible in comparison to capacitor 414. Thus, the resulting capacitance seen by node 430 is approximately equal to the parasitic capacitance 416. In this mode of operation, capacitor 412 is in parallel with the series combination of capacitors 414 and 416, which adds a negligible capacitance to capacitor 412. Thus, considered from node 420, capacitor 410 is effectively in series with capacitor 412, resulting in a capacitance of approximately $C_U/2$ for unit capacitance capacitors. As discussed above, parasitic effects are incorporated in computations utilized in designing implementations based on embodiments of the present invention.

When transistor 418 is ON, parasitic capacitor 416 is in parallel with ground and contributes a negligible capacitance. Thus, from node 420, capacitor 410 is in series with the combination of capacitors 412 and 414, which are in parallel. As described in relation to FIG. 2, if all capacitances being equal to a unit capacitance, the total capacitance on node 420 when the transistor 418 in ON is approximately equal to $C_U/3$. Thus, the difference in capacitance ΔC for the condition in which the transistor 418 is OFF and ON is $C_U/2 - C_U/3 = C_U/6$.

As described herein for purposes of clarity, capacitors in both the MSB cells (top branch) and the LSB cells (bottom branch) of FIG. 4B were selected to have capacitances equal to a unit capacitance value $C_U$. Of course, this is not required by embodiments of the present invention. In alternative embodiments, other capacitance values are selected as appropriate to the particular applications. Generally, the MSB cells utilize capacitors that are characterized by capacitance values larger than that associated with the LSB cells. Moreover, within the MSB or LSB portions, varying capacitance values may be utilized for different T-network units or conventional capacitors. One of ordinary skill in the art would recognize many variations, modifications, and alternatives.

In some applications, the capacitance values of the various cells in the capacitor bank are selected to be predetermined capacitance values, thereby providing for frequency overlap at the transitions between cells. For example, in an embodiment, a 6-bit MSB comprises 60 units rather than 64 and a 4-bit LSB comprises 14 units rather than 16. Of course, the particular capacitance values selected will depend on the particular applications.

Merely by way of example, the equivalent capacitance ($C_{eq}$) of a capacitor bank with 10 MSB cells and 4 LSB cells can be modeled as:

$$C_{eq} = (60-M)*C_P + M*C_U + (14-L)[C_{\Pi B} \sim (C_{\Pi C} + C_{P3})] + L*C_{\Pi B} \qquad (11),$$

where M represents the number of MSB units that are ON, L represents the number of LSB units that are ON, $C_P$ is the parasitic capacitance associated with the unit capacitance and NMOS transistors, $C_U$ is the unit capacitance, and "~" denotes "in series with." Based on calculations performed by the present inventors, for a certain VCO application, the desired unit capacitance is about 19.3 fF. In some embodiments, the MSB capacitor bank cells are adjusted to have a Q ~20 in a worst case scenario, such that the Q of the capacitor bank does not dominate the tank Q. Other Q values are utilized in other embodiments.

Figure 5A:
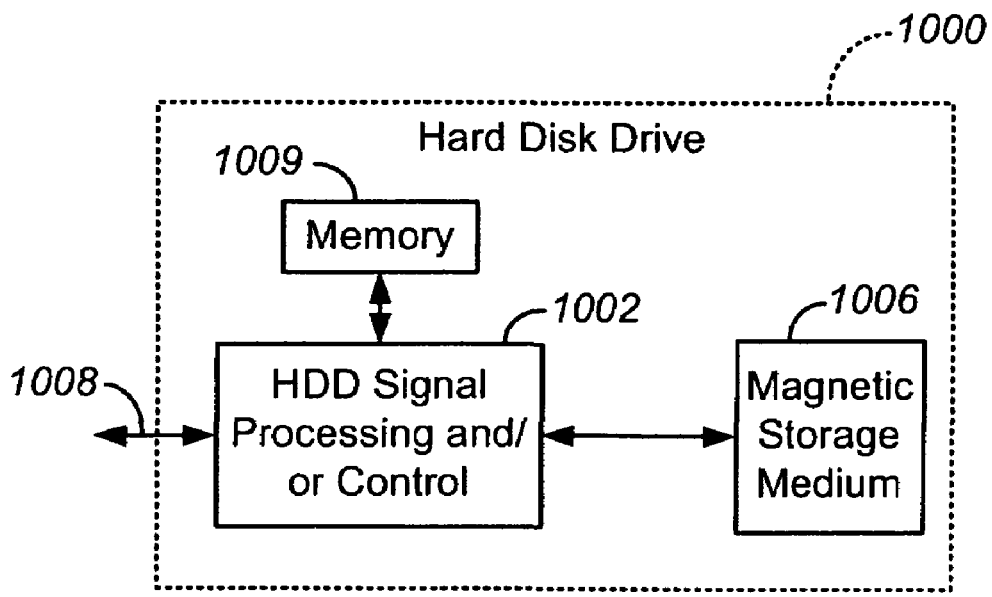
FIGS. 5A-5H show various devices in which the present invention may be embodied.

Referring now to FIGS. 5A-5G, various exemplary implementations of the present invention are shown. Referring to FIG. 5A, the present invention may be embodied in a hard disk drive 1000. The present invention may implement either or both signal processing and/or control circuits, which are generally identified in FIG. 5A at 1002. In some implementations, signal processing and/or control circuit 1002 and/or other circuits (not shown) in HDD 1000 may process data, perform coding and/or encryption, perform calculations, and/or format data that is output to and/or received from a magnetic storage medium 1006.

HDD 1000 may communicate with a host device (not shown) such as a computer, mobile computing devices such as personal digital assistants, cellular phones, media or MP3 players and the like, and/or other devices via one or more wired or wireless communication links 1008. HDD 1000 may be connected to memory 1009, such as random access memory (RAM), a low latency nonvolatile memory such as flash memory, read only memory (ROM) and/or other suitable electronic data storage.

Figure 5B:
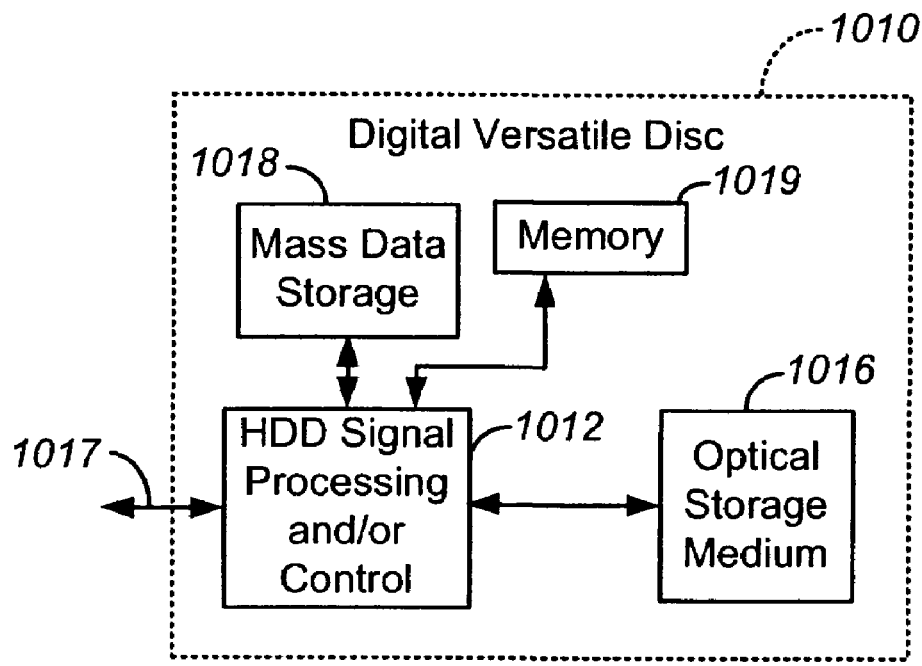

Referring now to FIG. 5B, the present invention may be embodied in a digital versatile disc (DVD) drive 1010. The present invention may implement either or both signal processing and/or control circuits, which are generally identified in FIG. 5B at 1012, and/or mass data storage 1018 of DVD drive 1010. Signal processing and/or control circuit 1012 and/or other circuits (not shown) in DVD 1010 may process data, perform coding and/or encryption, perform calculations, and/or format data that is read from and/or data written to an optical storage medium 1016. In some implementations, signal processing and/or control circuit 1012 and/or other circuits (not shown) in DVD 1010 can also perform other functions such as encoding and/or decoding and/or any other signal processing functions associated with a DVD drive.

DVD drive 1010 may communicate with an output device (not shown) such as a computer, television or other device via one or more wired or wireless communication links 1017. DVD 1010 may communicate with mass data storage 1018 that stores data in a nonvolatile manner. Mass data storage 1018 may include a hard disk drive (HDD) such as that shown in FIG. 5A. The HDD may be a mini HDD that includes one or more platters having a diameter that is smaller than approximately 1.8". DVD 1010 may be connected to memory 1019, such as RAM, ROM, low latency nonvolatile memory such as flash memory, and/or other suitable electronic data storage.

Figure 5C:
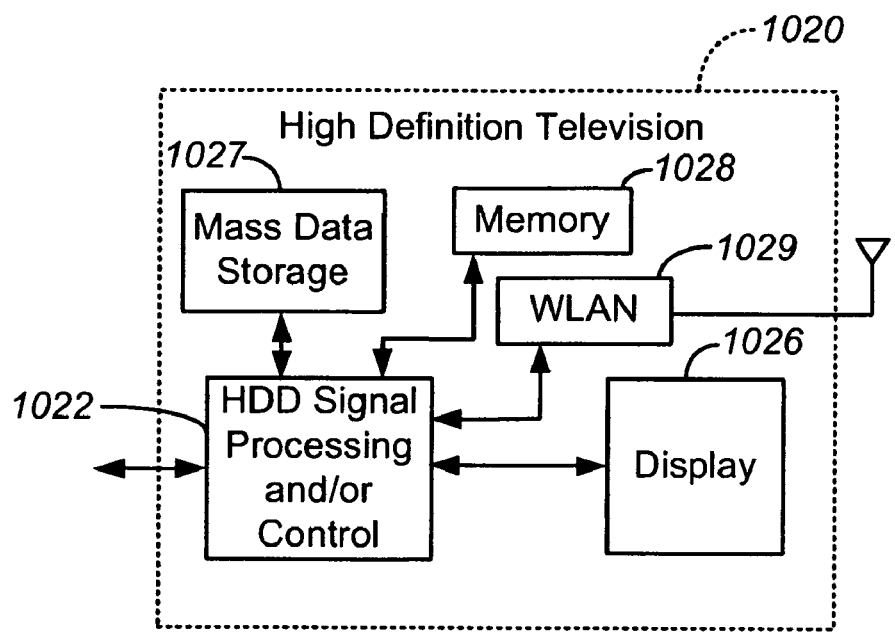

Referring now to FIG. 5C, the present invention may be embodied in a high definition television (HDTV) 1020. The present invention may implement either or both signal processing and/or control circuits, which are generally identified in FIG. 5C at 1022, a WLAN interface and/or mass data storage of the HDTV 1020. HDTV 1020 receives HDTV input signals in either a wired or wireless format and generates HDTV output signals for a display 1026. In some implementations, signal processing circuit and/or control circuit 1022 and/or other circuits (not shown) of HDTV 1020 may process data, perform coding and/or encryption, perform calculations, format data and/or perform any other type of HDTV processing that may be required.

HDTV 1020 may communicate with mass data storage 1027 that stores data in a nonvolatile manner such as optical and/or magnetic storage devices. At least one HDD may have the configuration shown in FIG. 5A and/or at least one DVD may have the configuration shown in FIG. 5B. The HDD may be a mini HDD that includes one or more platters having a diameter that is smaller than approximately 1.8". HDTV 1020 may be connected to memory 1028 such as RAM, ROM, low latency nonvolatile memory such as flash memory and/or other suitable electronic data storage. HDTV 1020 also may support connections with a WLAN via a WLAN network interface 1029.

Figure 5D:
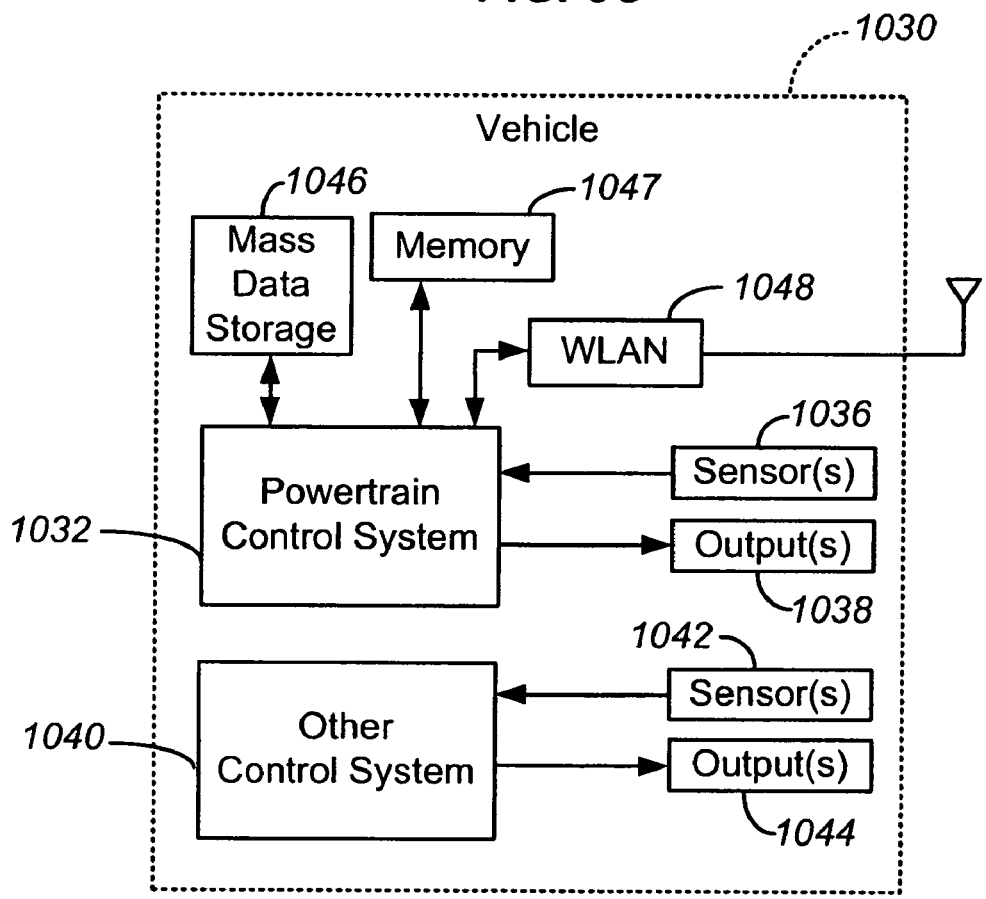

Referring now to FIG. 5D, the present invention implements a control system of a vehicle 1030, a WLAN interface and/or mass data storage of the vehicle control system. In some implementations, the present invention implements a powertrain control system 1032 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be embodied in other control systems 1040 of vehicle 1030. Control system 1040 may likewise receive signals from input sensors 1042 and/or output control signals to one or more output devices 1044. In some implementations, control system 1040 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

Powertrain control system 1032 may communicate with mass data storage 1046 that stores data in a nonvolatile manner. Mass data storage 1046 may include optical and/or magnetic storage devices for example hard disk drives HDD and/or DVDs. At least one HDD may have the configuration shown in FIG. 5A and/or at least one DVD may have the configuration shown in FIG. 5B. The HDD may be a mini HDD that includes one or more platters having a diameter that is smaller than approximately 1.8". Powertrain control system 1032 may be connected to memory 1047 such as RAM, ROM, low latency nonvolatile memory such as flash memory and/or other suitable electronic data storage. Powertrain control system 1032 also may support connections with a WLAN via a WLAN network interface 1048. The control system 1040 may also include mass data storage, memory and/or a WLAN interface (all not shown).

Figure 5E:
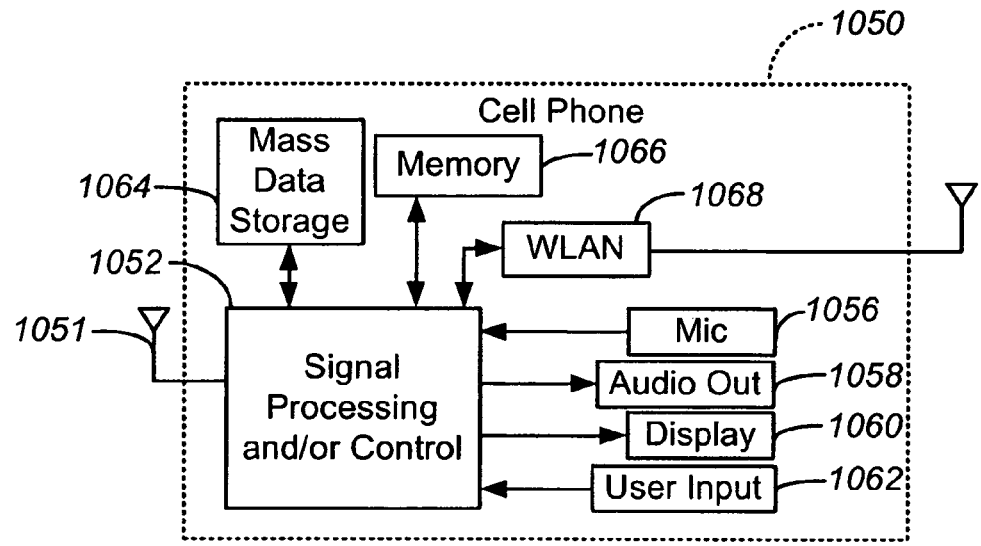

Referring now to FIG. 5E, the present invention may be embodied in a cellular phone 1050 that may include a cellular antenna 1051. The present invention may implement either or both signal processing and/or control circuits, which are generally identified in FIG. 5E at 1052, a WLAN interface and/or mass data storage of the cellular phone 1050. In some implementations, cellular phone 1050 includes a microphone 1056, an audio output 1058 such as a speaker and/or audio output jack, a display 1060 and/or an input device 1062 such as a keypad, pointing device, voice actuation and/or other input device. Signal processing and/or control circuits 1052 and/or other circuits (not shown) in cellular phone 1050 may process data, perform coding and/or encryption, perform calculations, format data and/or perform other cellular phone functions.

Cellular phone 1050 may communicate with mass data storage 1064 that stores data in a nonvolatile manner such as optical and/or magnetic storage devices for example hard disk drives HDD and/or DVDs. At least one HDD may have the configuration shown in FIG. 5A and/or at least one DVD may have the configuration shown in FIG. 5B. The HDD may be a mini HDD that includes one or more platters having a diameter that is smaller than approximately 1.8". Cellular phone 1050 may be connected to memory 1066 such as RAM, ROM, low latency nonvolatile memory such as flash memory and/or other suitable electronic data storage. Cellular phone 1050 also may support connections with a WLAN via a WLAN network interface 1068.

Figure 5F:
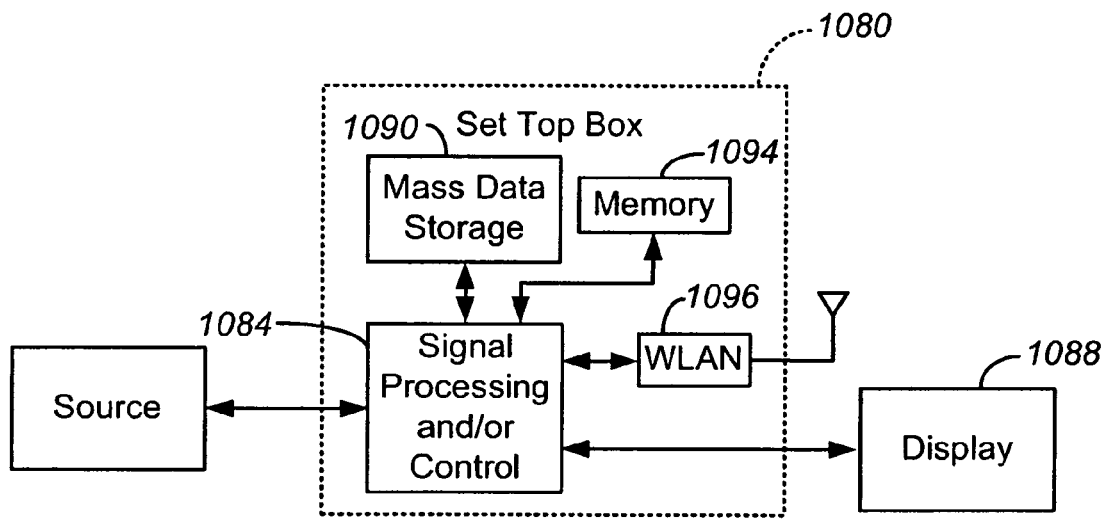

Referring now to FIG. 5F, the present invention may be embodied in a set top box 1080. The present invention may implement either or both signal processing and/or control circuits, which are generally identified in FIG. 5F at 1084, a WLAN interface and/or mass data storage of the set top box 1080. Set top box 1080 receives signals from a source such as a broadband source and outputs standard and/or high definition audio/video signals suitable for a display 1088 such as a television and/or monitor and/or other video and/or audio output devices. Signal processing and/or control circuits 1084 and/or other circuits (not shown) of the set top box 1080 may process data, perform coding and/or encryption, perform calculations, format data and/or perform any other set top box function.

Set top box 1080 may communicate with mass data storage 1090 that stores data in a nonvolatile manner. Mass data storage 1090 may include optical and/or magnetic storage devices for example hard disk drives HDD and/or DVDs. At least one HDD may have the configuration shown in FIG. 5A and/or at least one DVD may have the configuration shown in FIG. 5B. The HDD may be a mini HDD that includes one or more platters having a diameter that is smaller than approximately 1.8". Set top box 1080 may be connected to memory 1094 such as RAM, ROM, low latency nonvolatile memory such as flash memory and/or other suitable electronic data storage. Set top box 1080 also may support connections with a WLAN via a WLAN network interface 1096.

Figure 5G:
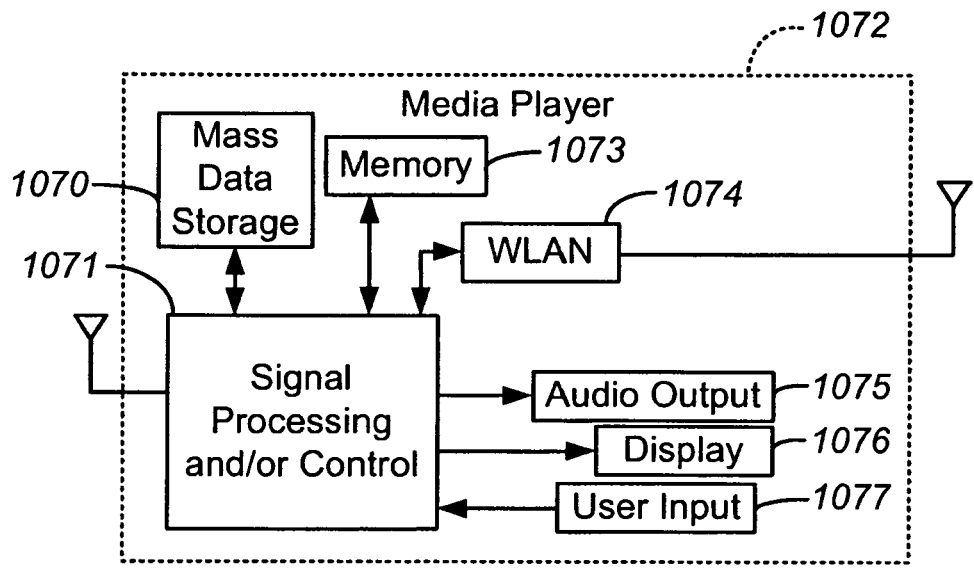

Referring now to FIG. 5G, the present invention may be embodied in a media player 1072. The present invention may implement either or both signal processing and/or control circuits, which are generally identified in FIG. 5G at 1071, a WLAN interface and/or mass data storage of the media player 1072. In some implementations, media player 1072 includes a display 1076 and/or a user input 1077 such as a keypad, touchpad and the like. In some implementations, media player 1072 may employ a graphical user interface (GUI) that typically employs menus, drop down menus, icons and/or a point-and-click interface via display 1076 and/or user input 1077. Media player 1072 further includes an audio output 1075 such as a speaker and/or audio output jack. Signal processing and/or control circuits 1071 and/or other circuits (not shown) of media player 1072 may process data, perform coding and/or encryption, perform calculations, format data and/or perform any other media player function.

Media player 1072 may communicate with mass data storage 1070 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 5A and/or at least one DVD may have the configuration shown in FIG. 5B. The HDD may be a mini HDD that includes one or more platters having a diameter that is smaller than approximately 1.8". Media player 1072 may be connected to memory 1073 such as RAM, ROM, low latency nonvolatile memory such as flash memory and/or other suitable electronic data storage. Media player 1072 also may support connections with a WLAN via a WLAN network interface 1074.

Figure 5H:
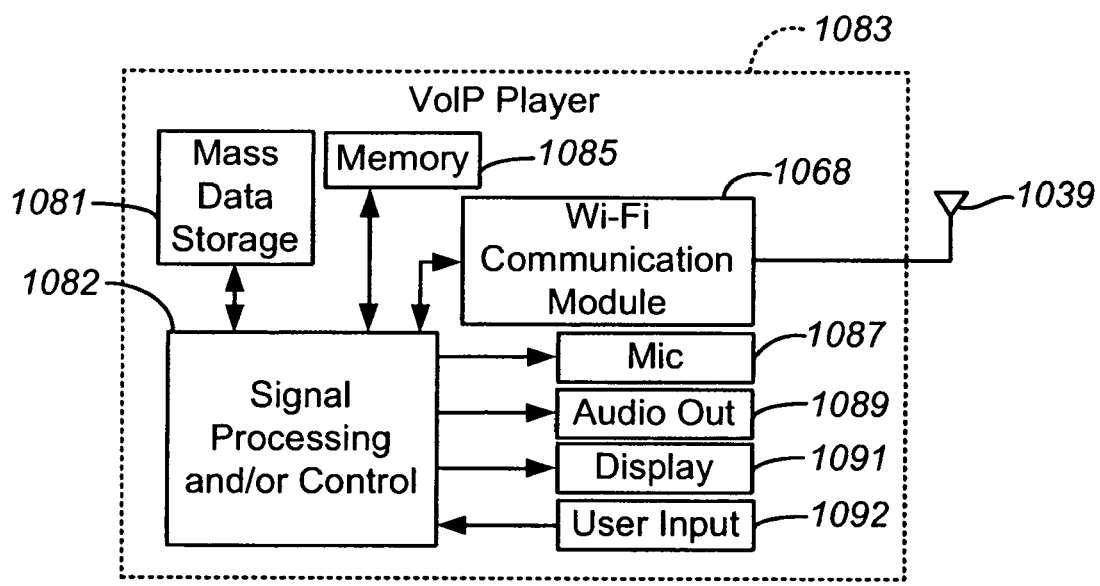

Referring to FIG. 5H, the present invention may be embodied in a Voice over Internet Protocol (VoIP) phone 1083 that may include an antenna 1039. The present invention may implement either or both signal processing and/or control circuits, which are generally identified in FIG. 5H at 1082, a wireless interface and/or mass data storage of the VoIP phone 1083. In some implementations, VoIP phone 1083 includes, in part, a microphone 1087, an audio output 1089 such as a speaker and/or audio output jack, a display monitor 1091, an input device 1092 such as a keypad, pointing device, voice actuation and/or other input devices, and a Wireless Fidelity (Wi-Fi) communication module 1086. Signal processing and/or control circuits 1082 and/or other circuits (not shown) in VoIP phone 1083 may process data, perform coding and/or encryption, perform calculations, format data and/or perform other VoIP phone functions.

VoIP phone 1083 may communicate with mass data storage 502 that stores data in a nonvolatile manner such as optical and/or magnetic storage devices, for example hard disk drives HDD and/or DVDs. At least one HDD may have the configuration shown in FIG. 5A and/or at least one DVD may have the configuration shown in FIG. 5B. The HDD may be a mini HDD that includes one or more platters having a diameter that is smaller than approximately 1.8". VoIP phone 1083 may be connected to memory 1085, which may be a RAM, ROM, low latency nonvolatile memory such as flash memory and/or other suitable electronic data storage. VoIP phone 1083 is configured to establish communications link with a VoIP network (not shown) via Wi-Fi communication module 1086. Still other implementations in addition to those described above are contemplated.

The above embodiments of the present invention are illustrative and not limitative. Various alternatives and equivalents are possible. The invention is not limited by the type of comparator, counter, pulse-width modulator, driver, or filter used. The invention is not limited by the type of amplifier used to establish the reference charging and discharging currents. The invention is not limited by the of oscillator. The invention is not limited by the type of integrated circuit in which the present disclosure may be disposed. Nor is the invention limited to any specific type of process technology, e.g., CMOS, Bipolar, or BICMOS that may be used to manufacture the present disclosure. Other additions, subtractions or modifications are obvious in view of the present disclosure and are intended to fall within the scope of the appended claims.

What is claimed is:

1. A capacitor bank adapted to provide a variable capacitance to an electronic circuit, the capacitor bank having at least a most significant bit and a least significant bit, the capacitor bank comprising:
    a first capacitor cell having a first capacitance value and disposed between a first node and a second node, thereby forming the most significant bit; and
    a second capacitor cell having a second capacitance value and disposed between the first node and the second node, thereby forming the least significant bit, wherein the second capacitance value is less than the first capacitance value and wherein the second capacitor cell comprises:
    a transistor;
    a first T-network capacitor unit in electrical communication with a source of the transistor, and
    a second T-network capacitor unit in electrical communication with a drain of the transistor.

2. The capacitor bank of claim 1 wherein the first T-network capacitor unit comprises:
    a first MIM capacitor in electrical communication with the first node and a third node;
    a second MIM capacitor in electrical communication with the third node and a voltage supply; and a third MIM capacitor in electrical communication with the third node and the source of the transistor.

3. The capacitor bank of claim 2 wherein the voltage supply comprises an electrical ground.

4. The capacitor bank of claim 1 wherein the second capacitance value is adapted to vary as a function of the conductive state of the transistor.

5. The capacitor bank of claim 4 wherein the least significant bit defines a least significant bit of a binary number.

6. The capacitor bank of claim 1 wherein the transistor comprises an NMOS transistor.

7. The capacitor bank of claim 1 wherein the first capacitance value is adapted to vary as a function of the conductive state of a second transistor.

8. The capacitor bank of claim 1 further comprising a third capacitor cell adapted to provide a portion of the second capacitance value, wherein the third capacitor cell is in parallel with the second capacitor cell.

9. The capacitor bank of claim 1 wherein the first capacitor cell comprises:
 a second transistor;
 a first capacitor in electrical communication with the first node and a source of the second transistor; and
 a second capacitor in electrical communication with a drain of the second transistor and the second node.

10. The capacitor bank of claim 9 wherein the first capacitor and the second capacitor are characterized by an equal capacitance value.

11. The capacitor bank of claim 9 wherein the most significant bit defines a most significant bit of a binary number.

12. The capacitor bank of claim 1 wherein the electronic circuit is a voltage controlled oscillator.

13. A capacitor cell comprising:
 a transistor;
 a first T-network capacitor unit in electrical communication with a first node and a source of the transistor; and
 a second T-network capacitor unit in electrical communication with a drain of the transistor and a second node,
 wherein the first T-network capacitor unit comprises three capacitors, each with substantially equal capacitance value.

14. The capacitor cell of claim 13 wherein the first T-network capacitor unit comprises:
 a first MIM capacitor in electrical communication with the first node and a third node;
 a second MIM capacitor in electrical communication with the third node and a voltage supply; and
 a third MIM capacitor in electrical communication with the third node and the source of the transistor.

15. The capacitor cell of claim 14 wherein the voltage supply comprises an electrical ground.

16. The capacitor cell of claim 13 wherein the second T-network capacitor unit comprises three capacitors characterized by the equal capacitance value.

17. The capacitor cell of claim 13 wherein the capacitor cell defines a least significant bit of a binary number.

18. The capacitor cell of claim 13 wherein the transistor comprises an NMOS transistor.

19. The capacitor cell of claim 13 wherein the capacitor cell is adapted to provide a variable capacitance to an electronic circuit.

20. The capacitor cell of claim 19 wherein the electronic circuit is a voltage controlled oscillator.

21. A method of providing a variable capacitance to an electronic circuit, the variable capacitance including a most significant bit portion and a least significant bit portion, the method comprising:
 providing a first capacitance value between a first node and a second node utilizing a first capacitor cell, wherein the first capacitor cell forms the most significant bit; and
 providing a second capacitance value between the first node and the second node utilizing a second capacitor cell, wherein the second capacitance value is less than the first capacitance value and the second capacitor cell forms the least significant bit, and wherein providing a second capacitance value further comprises:
 providing a transistor,
 providing a first T-network capacitor unit in electrical communication with a source of the transistor, and
 providing a second T-network capacitor unit in electrical communication with a drain of the transistor.

22. The method of claim 21 wherein providing the first T-network capacitor unit comprises:
 providing a first MIM capacitor in electrical communication with the first node and a third node;
 providing a second MIM capacitor in electrical communication with the third node and a voltage supply; and
 providing a third MIM capacitor in electrical communication with the third node and the source of the transistor.

23. The method of claim 21 further comprising modifying a conductive state of the transistor, thereby varying the second capacitance value.

24. The method of claim 21 wherein providing a transistor comprises providing an NMOS transistor.

25. The method of claim 21 wherein utilizing the first capacitor cell comprises providing a second transistor.

26. The method of claim 25 further comprising modifying a conductive state of the second transistor, thereby varying the first capacitance value.

27. The method of claim 21 further comprising providing a third capacitor cell in parallel with the second capacitor cell, the third capacitor cell having a portion of the second capacitance value.

28. The method of claim 21 wherein utilizing the first capacitor cell further comprises:
 providing a second transistor;
 providing a first capacitor in electrical communication with the first node and a source of the second transistor; and
 providing a second capacitor in electrical communication with a drain of the second transistor and the second node.

29. The method of claim 28 wherein the first capacitor and the second capacitor are characterized by an equal capacitance value.

30. The method of claim 21 wherein providing a variable capacitance to an electronic circuit comprises providing a variable capacitance to a voltage controlled oscillator.

* * * * *